United States Patent [19]
Keller

[11] 3,954,416
[45] May 4, 1976

[54] APPARATUS FOR POSITIVELY DOPING SEMICONDUCTOR CRYSTALS DURING ZONE MELTING

[75] Inventor: Wolfgang Keller, Munich, Germany

[73] Assignee: Siemens Aktiengesellschaft, Berlin & Munich, Germany

[22] Filed: July 11, 1974

[21] Appl. No.: 487,390

[30] Foreign Application Priority Data
July 27, 1973  Germany............................ 2338338

[52] U.S. Cl. ............................ 23/273 SP; 156/605; 156/620; 13/DIG. 1
[51] Int. Cl.² ......................................... B01J 17/10
[58] Field of Search ..................... 23/273 SP, 273 Z; 156/605, 620; 13/DIG. 1

[56] References Cited
UNITED STATES PATENTS

| | | | |
|---|---|---|---|
| 2,851,341 | 9/1958 | Weiss................................... | 156/605 |
| 2,904,512 | 9/1959 | Horn.................................... | 156/605 |
| 3,494,742 | 2/1970 | Kuba................................... | 23/273 Z |
| 3,607,109 | 9/1971 | Capita................................ | 23/273 Z |

Primary Examiner—Wilbur L. Bascomb, Jr.
Assistant Examiner—S. J. Emery
Attorney, Agent, or Firm—Hill, Gross, Simpson, Van Santen, Steadman, Chiara & Simpson

[57] ABSTRACT

A method and apparatus for positively introducing dopants into semiconductor crystals via crucible-free zone melting whereby a polycrystalline rod is mounted at opposite ends thereof in a housing which includes an annular induction heating coil surrounding a section of the rod for producing a melt zone at such section and a thin dopant source rod having a predetermined amount of dopant therein is controllably fed into the melt zone so that a positively determinable amount of dopant is provided in the recrystallized rod.

10 Claims, 2 Drawing Figures

APPARATUS FOR POSITIVELY DOPING SEMICONDUCTOR CRYSTALS DURING ZONE MELTING

BACKGROUND OF THE INVENTION

1. Field of the Invention

The invention relates to doping semiconductor crystals and somewhat more particularly to a method and apparatus for positively doping semiconductor crystals via zone melting.

2. Prior Art

Generally, semiconductor crystalline rods are doped by depositing a semiconductor material from a suitable gaseous phase by thermal and/or pyrolitic decomposition of a gaseous compound of the semiconductor material onto a heated rod-like carrier member composed of the same semiconductor material. Select dopants are mixed with the gaseous compounds of the semiconductor material and are deposited on the carrier body. The semiconductor crystalline rods produced in this manner are polycrystalline and must be transformed into a monocrystalline state by a subsequent zone melting process. During such transformation the concentration of dopants often changes in an uncontrollable manner so that substantially higher dopant concentrations must be originally provided to enable a desired dopant concentration to exist in the final semiconductor rod, which may have to undergo a plurality of zone melting cycles.

Such prior art procedures are time-consuming and inaccurate. Apparatuses employed in carrying out such procedures are only capable of producing marginally satisfactory results and involve large capital and operating expenditures.

German Offenlegungsschrift 1,544,276 shows a process and apparatus for producing doped semiconductor crystalline rods wherein a gaseous dopant is guided to a melt zone on a semiconductor rod being processed inside an evacuated housing by a conduit which is open in the vicinity of the melt zone. With this type of process, the amount of dopant gas supplied to the melt zone is regulated with the aid of a valve located between the melt zone housing and the dopant supply housing and by the pressure within the dopant supply housing, which is maintained at a constant temperature. The dopants used in this process preferably are such compounds of boron and phosphorus which are easily handled and readily vaporized, for example, trimetric phosphorus nitrilochloride. A disadvantage of this process is that the valves which regulate the quantity of dopant do not operate accurately (generally, commercially available needle valves or pulse-controlled magnetic valves are used for this purpose). Accordingly, the reproducibility of a dopant concentration within a semiconductor rod produced in this manner is unreliable.

German Offenlegungsschrift 2,020,182 shows an apparatus for doping semiconductor rods by the crucible-free zone melting technique with an induction heating coil which annularly surrounds the rod and which includes a conduit therein through which a gaseous dopant is blown or carried directly into the molten zone with the aid of a carrier gas stream. This device enables the production of semiconductor rods having a relatively constant and adjustable dopant concentration with approximately just one zone melting cycle. The dopant concentration in a so-produced semiconductor rod is dependent upon the carrier gas flow. This apparatus is useful with readily vaporizable compounds of boron or phosphorus. However, the dopant concentration with a carrier gas stream may vary and no positive means accurately determining the amount of dopant introduced into the treated semiconductor rod is available.

SUMMARY OF THE INVENTION

The invention provides an apparatus and process which positively dopes an undoped semiconductor crystalline rod during a crucible-free zone melting in a protective gas atmosphere or in a vacuum with a single zone melting cycle in an economical and simple manner.

With the practice of the invention, it is feasible to manufacture semiconductor rods having higher electrical resistance values than heretofore available in an accurate fashion, particularly rods having an electrical resistance above 100 Ohm · cm. over the entire length and cross-section of the rod.

In accordance with the principles of the invention, a dopant source comprised of a relatively thin semiconductor rod having a select dopant concentration therein is controllably fed into the melt zone of a semiconductor rod being doped at a specific rate or speed so as to melt within the melt zone and form an indistinguishable part of the so-doped semiconductor rod. In certain embodiments of the invention, the thin dopant source rod may be rotated during feeding thereof into the melt zone so as to achieve improved distribution of dopants within the melt zone.

The apparatus embodiment of the invention includes a flat induction heating coil having a tube insert therein for guiding the thin dopant source rod through the coil to the open center thereof. With this type of coil, the melt zone on a semiconductor rod within the open center of the coil can be maintained quite narrow.

In a preferred embodiment of the invention, the dopant source comprises a thin rod having a diameter in the range of about 2 to 10 mm. and a sufficient quantity of dopant therein to exhibit a specific electrical resistance in the range of about $10^{-3}$ to 10 Ohm centimeters. The rate of speed of feeding such a solid dopant source rod to a melt zone is preferably in the range of about 1 to 10 millimeters per minute.

DESCRIPTION OF THE PREFERRED EMBODIMENTS

Figure 1:
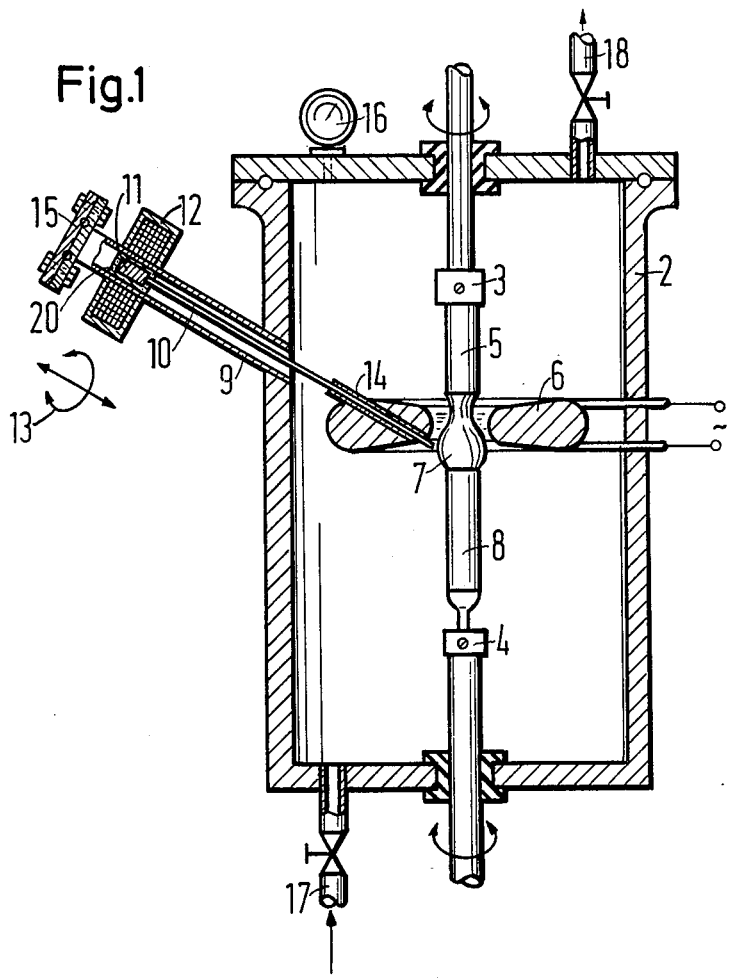
FIG. 1 is a schematic view, partially in section, of an embodiment of an apparatus constructed in accordance with the principles of the invention.

The invention provides an apparatus and method of positively doping a semiconductor crystalline rod by controllably feeding a solid dopant source to a melt zone of a semiconductor rod being processed via the crucible-free zone melting process.

Generally, the method embodiment of the invention comprises establishing a melt zone on a semiconductor crystalline rod and controllably feeding a solid dopant source rod toward the melt zone at a select feed rate in accordance with the desired degree of doping so that the dopant source rod is melted into the semiconductor crystalline rod undergoing crucible-free zone melting.

Somewhat more specifically, the method embodiment of the invention comprises positioning a stock semiconductor rod in an operational environment for a zone melting treatment, i.e., mounting the rod at its opposite ends within a hollow container and within an annular heating coil which produces a melt zone on the rod and feeding a solid dopant source comprised of a relatively thin semiconductor rod having a predetermined dopant concentration therein toward the melt zone at a controlled feed rate in accordance with the desired degree of dopant to be added to the semiconductor rod so that the solid dopant source is melted within the semiconductor rod. Feeding of the solid dopant source may include rotating the solid dopant source rod about its longitudinal axis and linearly moving the rod toward the melt zone. In preferred embodiments, the controlled feeding is accomplished by magnetically coupling the dopant source rod with a movable electromagnet which is controllably moved to feed the source rod to the melt zone. The feed rate of the dopant source rod to the melt zone is preferably in the range of about 1 to 10 mm/min. and the dopant source rod preferably has a diameter in the range of about 2 to 10 mm and a dopant concentration sufficient to exhibit a specific electrical resistance in the range of about $10^{-3}$ to 10 Ohm $\cdot$ cm.

Generally, the apparatus embodiment of the invention comprises a hollow container having controllable gas inlet and outlet openings, a pair of rod holding members mounted on opposite walls of the container for supporting a semiconductor rod therebetween, an annular induction heating coil within the container positioned so as to surround a section of a rod mounted between the holding members, a gas impermeable tube mounted on a wall of the container and in communication with the interior of the container and in alignment with the center of the heating coil, a ferromagnetic core movably mounted within the gas impermeable tube, a relatively thin solid dopant source rod attached to a lower surface of the ferromagnetic core so as to be movable therewith within the gas impermeable tube and movable electromagnets positioned outside the gas impermeable tube in a magnetically coupling relation with the ferromagnetic core for selective movement of the dopant source rod toward the heating coil. In preferred embodiments, the gas impermeable tube is composed of a non-magnetic metal, such as brass or steel. The electromagnets are rotationally and axially movable along the gas impermeable tube so that the solid dopant source may be rotationally and/or axially moved within the tube as desired. In a preferred embodiment, the induction heating coil is a single or multi-turn flat coil having a tube insert therethrough in alignment with the gas impermeable tube so as to receive the thin dopant source rod from the gas impermeable tube and guide it toward the center area of the coil. The tube insert is composed of an outer metal cylinder, such as composed of copper or silver and has an inner lining of quartz. A heat-exchange hydraulic circuit may be provided within the coil for temperature control. In preferred embodiments, the solid dopant source rod has a diameter in the range of about 2 to 10 mm and a dopant concentration sufficient to exhibit a specific electrical resistance in the range of about $10^{-3}$ to 10 Ohm $\cdot$cm.

The invention provides a means of positively doping an undoped semiconductor crystalline rod during a crucible-free zone melting process in a protective gas or vacuum environment with a single pass or cycle of the melt zone along the rod in an economical and simple manner. By practicing the principles of the invention, one can readily attain relatively high specific electrical resistance values, particularly values above 100 Ohm $\cdot$ cm over the entire length and cross-section of a semiconductor rod in an accurate and reproducible manner.

A solid dopant source is used in accordance with the invention which comprises a relatively thin semiconductor crystalline rod having a predetermined dopant concentration therein. This solid dopant source is moved toward a melt zone on a semiconductor rod at a select feed rate in accordance with the desired degree of doping so as to be melted into the semiconductor rod being doped. The solid dopant source may be rotated about its longitudinal axis as it is being fed into a melt zone so as to achieve an improved distribution of dopants within the melt zone. In a preferred embodiment, the solid dopant source comprises a thin rod having a diameter in the range of about 2 to 10 mm, which contains a sufficient dopant concentration therein to exhibit a specific electrical resistance of about $10^{-3}$ to 10 Ohm $\cdot$ cm. A preferred feed rate of the solid dopant source into a melt zone is in the range of about 1 to 10 mm/min.

In accordance with the principles of the invention, the melt zone on a semiconductor crystalline rod is produced by an annular induction heating coil which is in the form of a single or multi-turn flat coil and has a tube insert mounted thereon, as by soldering, for guiding the solid dopant source through the coil to the melt zone. In this manner, the melt zone on a semiconductor rod can be maintained very narrow. By using a doped thin semiconductor rod, which is arranged to be axially displaced, as a dopant source, one may selectively dope a given semiconductor crystalline rod via crucible-free zone melting in a protective gas atmosphere or in a vacuum with reproducible and highly accurate dopant concentrations. The dopant concentration as provided by the invention is dependent on:

1. The dopant concentration within the thin rod;
2. The thickness and cross-section of the thin rod; and
3. The feed rate or speed of the thin rod into the melt zone.

Since the foregoing parameters are accurately controllable, the positive doping of a semiconductor crystalline rod may be achieved in a simple manner.

The method of the invention may be practiced by an apparatus which is characterized by a gas impermeable hollow container provided with a controlled gas inlet and gas outlet for introducing select atmosphere environment within the housing, such as a protective gas atmosphere or a vacuum. The container includes selectively movable rod holding members mounted on opposite walls, such as the base and the top, of the container for vertically supporting a semiconductor rod. An induction heating coil is provided between the holding members so as to annularly surround the semiconductor rod mounted between the holding members and is operationally connected through a wall of the container to a source of electrical energy. A gas impermeable tube is attached to a wall of the housing and communicates with the interior of the housing. The tube is aligned so as to be in direct line with the melt zone. A ferromagnetic core is movable mounted within the gas impermeable tube and the solid dopant source rod is attached to the bottom surface of the core. Movable electromagnets are arranged about the gas impermeable tube so as to be magnetically coupled with the core within the tube. With this type of apparatus, the dopant source rod can be rotated within the gas impermeable tube, which in preferred embodiments is composed of brass, and be axially moved at a controlled rate to the melt zone of a semiconductor crystalline rod being doped.

The apparatus used to practice the invention is further characterized by an induction heating coil which is in the form of a flat coil and which includes a metal tube insert which is lined with quartz and functions to guide the solid dopant source rod through the coil to a melt zone. The induction heating coil may comprise a single or multiturn ring-shaped structure which is formed of two separable halves and include an interior fluid conduit system for circulating a heat-exchange fluid throughout the coil for control of the temperature thereof. The tube insert mentioned earlier is attached, as by hard solder, to one of the two separable halves of such a coil. This type of coil structure is exceptionally useful in producing very thick semiconductor crystalline rods.

In another embodiment, the induction heating coil is provided with at least one turn of a circular cross-section and the tube insert is attached to the inner surface of such a coil.

The tube insert is comprised of an outer cylinder composed of a non-magnetic corrosion-resistant metal, preferably selected from the group consisting of copper and silver and an inner cylinder composed of quartz or the like provided for lining the outer cylinder. The tube insert may be connected to a coil surface by hard solder or the like.

For further details of the invention, reference is made to the drawings wherein an exemplary embodiment of an apparatus useful in the practice of the invention is shown. A vertical semiconductor crystalline stock rod 5, for example, composed of silicon, which is initially undoped, is shown as being supported by a pair of holding members 3 and 4 positioned within a container 2 for crucible-free zone melting. An induction heating coil 6 (a so-called apertured pancake coil) which is in the form of a flat coil is positioned within the container 2 so as to produce a melt zone 7 on rod 5 and from which a doped monocrystalline rod 8 is pulled. A tube 9, composed of a non-magnetic corrosion-resistant metal, such as brass or steel, is attached to a wall of the container 2 in a vacuum-tight manner so that there is communication between the interiors of the tube and the container. A thin solid dopant source rod 10, for example, a boron-doped silicon crystalline rod having a specific electrical resistance of 1 Ohm · cm and a diameter of 3 mm is positioned within the tube 9. A ferromagnetic core 11 having an insulating layer 20 thereabout is attached to the upper end of the thin rod 10. The ferromagnetic core 11 is coupled to driving electromagnets 12 which are positioned outside the tube 9 and container 2 so that the dopant source rod 10 may be rotationally and axially moved, as illustrated by arrows 13. The lower end of the dopant source rod 10 is guided through a tube insert 14 which is attached to the heating coil 6. The tube insert is preferably composed of copper or silver and has an inner quartz lining. The tube 9 is sealed at its upper end in a gas impermeable manner by a suitable cover member 15.

A monometer 16 may be provided on the container 2 to indicate the gas pressure within the interior of the container. The gas pressure may be positive, such as produced by a pressurized source of a protective gas, such as argon, or the gas pressure may be negative, such as produced by a vacuum pump. A gas inlet line 17 and a gas outlet line 18 may be provided for introduction and withdrawal of gas from the interior of container 2. Valve means may be provided on each of the gas lines so as to regulate the environment within the container. When doping with a dopant which vaporizes in a vacuum (i.e. phosphorus) the vaporization factor must be taken into consideration, for example, by providing the protective gas within the container at a pressure sufficiently high to prevent vaporization.

For example, if it is desired to produce a silicon crystalline rod doped with boron so as to exhibit a specific resistance of about 140 Ohm · cm., one obtains or provides a thin silicon rod having a diameter of 3 mm and a sufficient concentration of boron therein to exhibit a specific electrical resistance of 1 Ohm · cm. Then utilizing an apparatus of the type described hereinabove, this thin boron-doped silicon rod is melted into the melt zone of an undoped highly ohmic silicon crystalline stock rod (having a diameter of 50 mm and a specific electrical resistance greater than 2000 Ohm · cm) at a feed rate of 6 mm/min. and a pulling rate of 3 mm/min. is set during the crucible-free zone melting process. From the values of the melted silicon stock rod (6 cm$^3$) per minute and the weight of the melted doped silicon thin rod (42 mm$^3$) per minute, the dilution factor may be calculated as being equal to: 6000/42, which is equal to about 140. Accordingly, the amount or concentration of the dopant within the finished rod will exhibit a specific electrical resistance of 140 Ohm · cm. For the crucible-free zone melting process, the conventional parameters are used for selecting the protecttive gas atmosphere and the rotating speed of the rod support or holding members. Of course, the thin rod may be doped with other select dopant materials, but preferably the dopants are selected from the group consisting of arsenic, boron and phosphorus.

Figure 2:
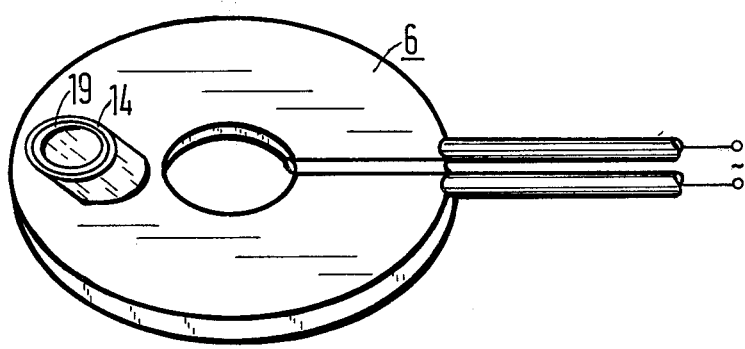
FIG. 2 is a plan view of a flat induction heating coil having a tube inserted thereon in accordance with the principles of the invention.

FIG. 2 illustrates an induction heating coil 6 which is in the form of a flat coil and is provided with a tube insert 14 attached to the coil surface by hard solder. The tube insert is preferably composed of copper or silver and has a quartz lining 19 therein.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

I claim as my invention:

1. An apparatus for introduction of a dopant into a semiconductor crystalline rod comprising:
    a gas impermeable hollow housing having a controlled gas inlet and gas outlet for introducing a select atmospheric environment within said housing;
    a pair of selectively movable rod-holding members mounted on opposite walls of said housing for supporting a semiconductor crystalline rod therebetween;
    an induction heating coil positioned within said housing and between said holding members so as to annularly surround the semiconductor rod mounted between said holding member and define a melt zone on said rod;

a gas impermeable tube attached to a wall of said housing and communicating with the interior of said housing, said tube being aligned with the melt zone on said semiconductor rod;

a ferromagnetic core movably mounted within said gas impermeable tube;

a relatively thin dopant source rod attached to a lower surface of said ferromagnetic core so as to be movable therewith within said gas impermeable tube, said induction heating coil being a flat coil and including a tube insert for guiding the dopant source rod through the coil to the melt zone; and movable electromagnets positioned outside said gas impermeable tube in magnetically coupling relation with said ferromagnetic core for selective movement of said dopant source rod toward the melt zone of the semiconductor crystalline rod mounted between said holding members.

2. An apparatus as defined in claim 1, wherein the gas impermeable tube is composed of a non-magnetic material.

3. An apparatus as defined in claim 1, wherein the electromagnets are rotationally and axially movable along the gas impermeable tube so that the dopant source is rotationally and axially movable toward the melt zone.

4. An apparatus as defined in claim 1, wherein the tube insert is comprised of an outer cylinder composed of a metal and an inner cylinder composed of quartz lining said outer cylinder.

5. An apparatus as defined in claim 4, wherein the metal forming the outer cylinder of the tube insert is selected from the group consisting of copper and silver.

6. An apparatus as defined in claim 1, wherein the tube insert is attached to the heating coil by a hard solder.

7. An apparatus as defined in claim 1, wherein the induction heating coil comprises at least a single-turn ring-shaped coil having an inner surface thereof defining an annular opening at the center of the coil, said ring-shaped coil being composed of two separable halves which include a heat-exchange circuit therebetween for circulating a heat-exchange fluid through said coil, and a tube insert comprised of an outer cylinder composed of a metal and an inner cylinder composed of quartz lining said outer cylinder, said tube insert being attached to one of said halves for guiding the dopant source rod through the coil to the melt zone.

8. An apparatus as defined in claim 1, wherein the dopant source rod has a diameter in the range of about 2 to 10 millimeters.

9. An apparatus as defined in claim 1, wherein the dopant source rod has a dopant concentration therein sufficient to exhibit a specific electrical resistance of about $10^{-3}$ to 10 Ohm · centimeters.

10. An apparatus as defined in claim 9, wherein the dopant within the dopant source rod is selected from the group consisting of arsenic, boron and phosphorus.

* * * * *